United States Patent
Ogura et al.

(10) Patent No.: US 8,415,801 B2
(45) Date of Patent: Apr. 9, 2013

(54) SEMICONDUCTOR DEVICE HAVING THERMAL ENDURANCE AND METHOD OF MANUFACTURING THE SAME

(75) Inventors: Masami Ogura, Tochigi (JP); Takahito Takayanagi, Tochigi (JP); Yuko Yamada, Tochigi (JP); Jun Kato, Tochigi (JP); Tsugio Masuda, Tochigi (JP); Tsukasa Aiba, Tochigi (JP); Fumitomo Takano, Tochigi (JP)

(73) Assignee: Honda Motor Co., Ltd., Tokyo (JP)

( * ) Notice: Subject to any disclaimer, the term of this patent is extended or adjusted under 35 U.S.C. 154(b) by 181 days.

(21) Appl. No.: 12/794,012

(22) Filed: Jun. 4, 2010

(65) Prior Publication Data

US 2010/0308465 A1 Dec. 9, 2010

(30) Foreign Application Priority Data

Jun. 4, 2009 (JP) .................. 2009-135499
Jun. 4, 2009 (JP) .................. 2009-135500

(51) Int. Cl.
 *H01L 23/488* (2006.01)
(52) U.S. Cl.
 USPC .............. 257/772; 257/E23.023; 438/122
(58) Field of Classification Search .......... 257/706, 257/772, E23.023; 438/122
 See application file for complete search history.

(56) References Cited

U.S. PATENT DOCUMENTS

| | | | | |
|---|---|---|---|---|
| 5,928,768 A * | 7/1999 | Ikeda et al. ............ | 428/210 |
| 2005/0145846 A1 | 7/2005 | Brandenburger | |
| 2006/0157862 A1 | 7/2006 | Nishimura | |
| 2007/0090497 A1 * | 4/2007 | Abbott ................ | 257/666 |
| 2008/0036097 A1 * | 2/2008 | Ito et al. ............ | 257/778 |
| 2009/0229864 A1 * | 9/2009 | Kuromitsu et al. .......... | 174/252 |

FOREIGN PATENT DOCUMENTS

| | | |
|---|---|---|
| CN | 101362238 A | 2/2009 |
| EP | 1 926 142 A1 | 5/2008 |
| JP | 2003-204020 A | 7/2003 |
| JP | 2006-041363 | 9/2006 |
| JP | 2006-237057 A | 9/2006 |
| JP | A-2006-351834 | 12/2006 |
| JP | 2007-141948 A | 6/2007 |
| KR | 2006-0084373 A | 7/2006 |

OTHER PUBLICATIONS

Korean Office Action issued on May 18, 2012 in Korean Patent Application 10-2010-0052203 and Translation.
Office Action issued in Korean Patent Application dated Nov. 19, 2012.
Japanese Office Action issued in counterpart Japanese Application No: 2009-135500Dated Oct. 31, 2012.

* cited by examiner

*Primary Examiner* — S. V Clark
*Assistant Examiner* — Krista Soderholm
(74) *Attorney, Agent, or Firm* — Arent Fox LLP

(57) ABSTRACT

There is provided a semiconductor device including: a circuit board formed by bonding a first and a second metal plates to both surfaces of an insulating substrate respectively, at least one semiconductor element to be bonded to an external surface of the first metal plate through a first solder, and a radiating base plate to be bonded to an external surface of the second metal plate through a second solder, wherein the first and the second solders are constituted by solder materials of the same type, and a ratio of a sum of thicknesses of the first and the second metal plates to a thickness of the insulating substrate is set in a predetermined range to ensure an endurance to a temperature stress of each of the first and the second solders.

9 Claims, 4 Drawing Sheets

SEMICONDUCTOR DEVICE HAVING THERMAL ENDURANCE AND METHOD OF MANUFACTURING THE SAME

CROSS-REFERENCE TO RELATED APPLICATION

This application is based on and claims priority under U.S.C. §119 from Japanese Patent Application Nos. 2009-135499 filed on Jun. 4, 2009 and 2009-135500 filed on Jun. 4, 2009.

BACKGROUND

1. Field

The present invention relates to a semiconductor device including a circuit board obtained by bonding metal plates to both sides of an insulating substrate respectively, at least one semiconductor element bonded to an external surface of one of the metal plates through a first solder, and a radiating base plate bonded to an external surface of the other metal plate through a second solder.

2. Description of the Related Art

The semiconductor device, for example, a power module to be used in a motor driving control system is required to have a sufficient insulating property and radiating property with an increase in a power. For this reason, an insulating substrate formed of ceramic is used to bond a power semiconductor element to a first copper plate bonded to one of surfaces through a lead based solder having a high melting temperature and to subsequently bond a radiating base plate to a second copper plate bonded to the other surface of the insulating substrate through a tin-lead based eutectic solder having a comparatively low melting temperature in order to prevent a bonded portion of the lead based solder from being molten again.

On the other hand, in recent years, a solder material is advanced to be lead-free in order to achieve an environmental protection. The lead-free solder has a melting temperature which is higher than that of the tin-lead based eutectic solder and is lower than that of the lead based solder. For this reason, there is a problem in that a solder bonding portion on an element side bonded earlier is molten again by a heat in a processing for bonding a radiating base plate, resulting in a remarkable deterioration in a bonding reliability if solder bonding is carried out by the conventional technique using the lead-free solder.

Moreover, the lead-free solder is harder than the lead based or tin-lead based solder. For this reason, there is a problem in that a crack is developed rapidly if it is once generated, resulting in a deterioration in an endurance.

Therefore, there are known a technique for bonding a semiconductor element to a radiating base plate by using two types of lead-free solders having different melting temperatures from each other (for example, see JP-A-2006-237057) in order to solve the former problem, and a technique for adding a rare metal such as bismuth or indium to a lead-free solder to enhance an endurance (for example, see JP-A-2007-141948) in order to solve the latter problem. Furthermore, there is also known a special technique for considerably changing a structure of a power module and hardening a solder bonding portion with a mold resin to carry out resin sealing.

In the technique described in JP-A-2006-237057, however, it is necessary to specially select and prepare the two types of lead-free solders having the different melting temperatures from each other, and furthermore, to properly use the two types of solders for a bond of a semiconductor element to an insulating substrate and a bond of a radiating base plate. The handling is complicated as a whole. In the technique described in JP-A-2007-141948, moreover, it is necessary to specially use an expensive rare metal as an additive material to a lead-free solder. After all, both of the techniques have a problem in that a material cost or a managing cost suddenly rises, and furthermore, a manufacturing process is forced to be changed, resulting in a considerable increase in the cost.

SUMMARY

In consideration of the circumstances, it is an object of the invention to provide a semiconductor device which is more inexpensive than that in the conventional art and can ensure a bonding reliability of a solder bonding portion with a conventionally ordinary and general module structure and a method of manufacturing the semiconductor device.

According to a first aspect of the invention, there is provided a semiconductor device including:

a circuit board (P) formed by bonding a first metal plate (M1) and a second metal plate (M2) to both surfaces of an insulating substrate (C) respectively, at least one semiconductor element (S, S') to be bonded to an external surface of the first metal plate (M1) through a first solder (H1), and a radiating base plate (B) to be bonded to an external surface of the second metal plate (M2) through a second solder (H2), wherein the first solder (H1) and the second solder (H2) are constituted by solder materials of the same type, and a ratio (a) of a sum ($t_M$) of thicknesses of the first metal plate (M1) and the second metal plate (M2) to a thickness ($t_C$) of the insulating substrate (C) is set in a range of from 1.5 to 5.5 to ensure an endurance to a temperature stress of each of the first solder and the second solder (H1, H2).

According to a second aspect of the invention, there is provided the semiconductor device according to the first aspect, wherein the first solder (H1) and the second solder (H2) are lead-free solders formed by an SnCu based, SnAg based or SnAgCu based alloy, and do not contain a rare metal.

According to a third aspect of the invention, there is provided a method of manufacturing a semiconductor device including a circuit board (P) formed by bonding a first metal plate (M1) and a second metal plate (M2) to both surfaces of an insulating substrate (C) respectively, at least one semiconductor element (S, S') to be bonded to an external surface of the first metal plate (M1) through a first solder (H1), and a radiating base plate (B) to be bonded to an external surface of the second metal plate (M2) through a second solder (H2), the method including the steps of:

manufacturing the circuit board (P) in such a manner that a ratio (a) of a sum ($t_M$) of thicknesses of the first metal plate (M1) and the second metal plate (M2) to a thickness ($t_C$) of the insulating substrate (C) is set in a predetermined range in which an endurance to a temperature stress of each of the first and the second solders (H1, H2) is ensured; and executing a processing for bonding the semiconductor elements (S, S') to the external surface of the first metal plate (M1) of the circuit board (P) through the first solder (H1) and a processing for bonding the base plate (B) to the external surface of the second metal plate (M2) through the second solder (H2) at the same time on the same heating condition, wherein the first solder (H1) and the second solder (H2) are constituted by lead-free solder materials of the same type.

According to a fourth aspect of the invention, there is provided the method of manufacturing a semiconductor device according to the third aspect, wherein the ratio (a) is in a range of from 1.5 to 5.5.

According to a fifth aspect of the invention, there is provided the method of manufacturing a semiconductor device according to the third or fourth aspect, wherein the first solder (H1) and the second solder (H2) are formed by SnCu based, SnAg based or SnAgCu based alloys, and do not contain a rare metal.

According to a sixth aspect of the invention, there is provided the method of manufacturing a semiconductor device according to the third or fourth aspect, wherein the processings are carried out in a reflow furnace in a reflow temperature of from 240° C. to 320° C.

In the invention, "lead-free solder materials of the same type" indicates lead-free solder materials having a principal lead-free component formed by the same alloy. For example, there is used a lead-free solder material selected from an SnCu based, SnAg based and SnAgCu based alloys. In the invention, "the lead-free solder materials of the same type" may optionally contain an additive. If the additive is contained, a composition of the contained additive and an amount of the addition may be the same or different in the first and second solders. In any case, it is desirable to select the compositions of the additives or the amounts of the addition in the first and second solders in such a manner that a difference in a melting point between the first and second solders is equal to or smaller than 20° C. (more specifically, a range in which a heating condition does not need to be changed as in JP-A-2006-237057).

BRIEF DESCRIPTION OF THE DRAWINGS

A general architecture that implements the various features of the invention will now be described with reference to the drawings. The drawings and the associated descriptions are provided to illustrate embodiments of the invention and not limited the scope of the invention.

DETAILED DESCRIPTION

Various embodiments according to the invention will be described hereinafter with reference to the accompanying drawings.

An embodiment according to the invention will be described below with reference to the accompanying drawings.

Figure 1:
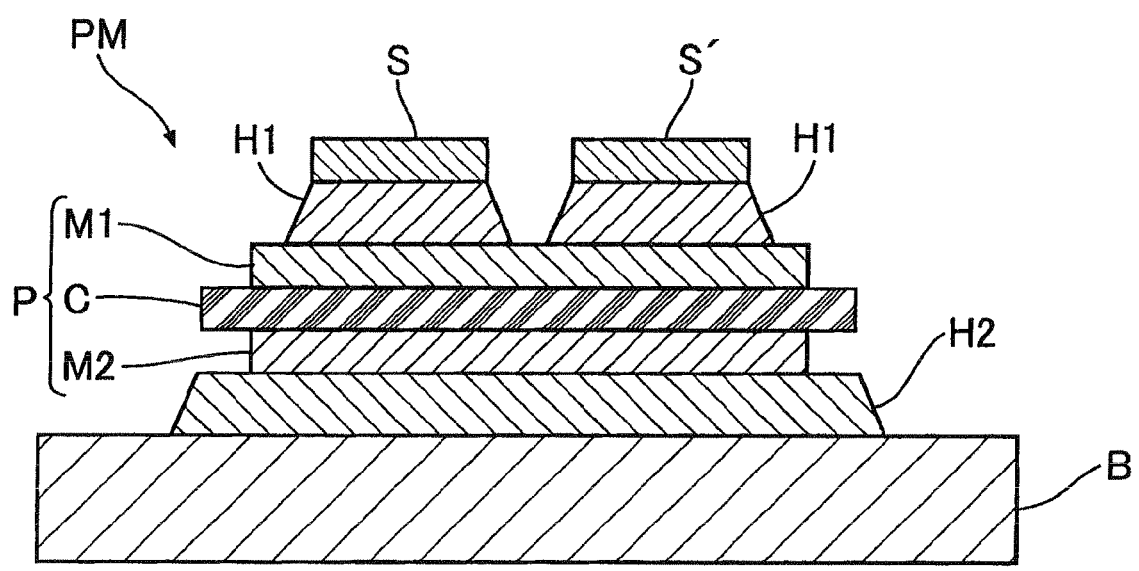
FIG. 1 is a sectional view showing a main part of a power module according to an example of the invention.
Figure 2:
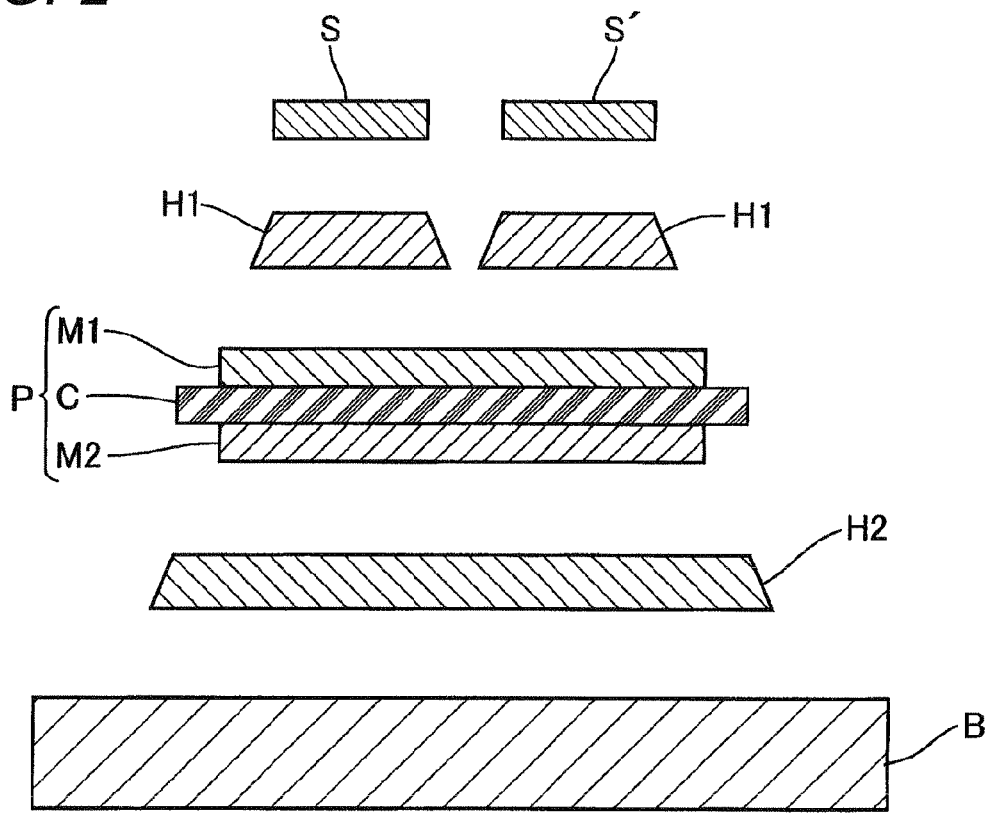
FIG. 2 is an exploded view showing the main part of the power module.

First of all, in FIGS. 1 and 2, a power module PM serving as a semiconductor device includes a circuit board P formed by integrally bonding first and second copper plates M1 and M2 to be first and second metal plates onto both surfaces of an insulating substrate C containing a ceramic material such as silicon nitride as a principal material, at least one semiconductor element S or S' bonded to an external surface of the first copper plate M1 through a first solder H1, and a radiating base plate B formed of copper and bonded to an external surface of the second copper plate M2 through a second solder H2. Each of the solders H1 and H2 is constituted by a lead-free solder material.

A structure of the circuit board P is basically identical to that of a DCB board which has conventionally been known.

For the first and second solders H1 and H2, moreover, there are used lead-free solder materials of the same type (which are identical to each other in the example), for instance, an inexpensive lead-free solder material which is an SnCu based, SnAg based or SnAgCu based alloy and does not contain an additive at all or contains an additive to be at least one of Ni, Co and Ge. An expensive additive for enhancing an endurance, for example, a rare metal such as bismuth or indium is not added. The lead-free solders have melting temperatures which are higher than a melting temperature of a tin-lead based eutectic solder and are lower than that of a lead based solder.

Accordingly, the following is found as a result of an analysis by the inventor. In the case in which the SnCu based, SnAg based or SnAgCu based lead-free solder material is used as the first solder H1 on the semiconductor element S and S' side, it has a sufficiently higher melting temperature (approximately 220° C.) than an operating temperature (160° C. or less) of the element and is not molten again through a heat generation in a use of the semiconductor element in the same manner as the conventional lead based high-melting solder. In the case in which the lead-free solder material is used as the second solder H2 on the radiating base plate B side, moreover, an enhancement in an endurance to a heat can be expected more greatly than in the case in which the conventional tin-lead based eutectic solder is used.

Figure 3:
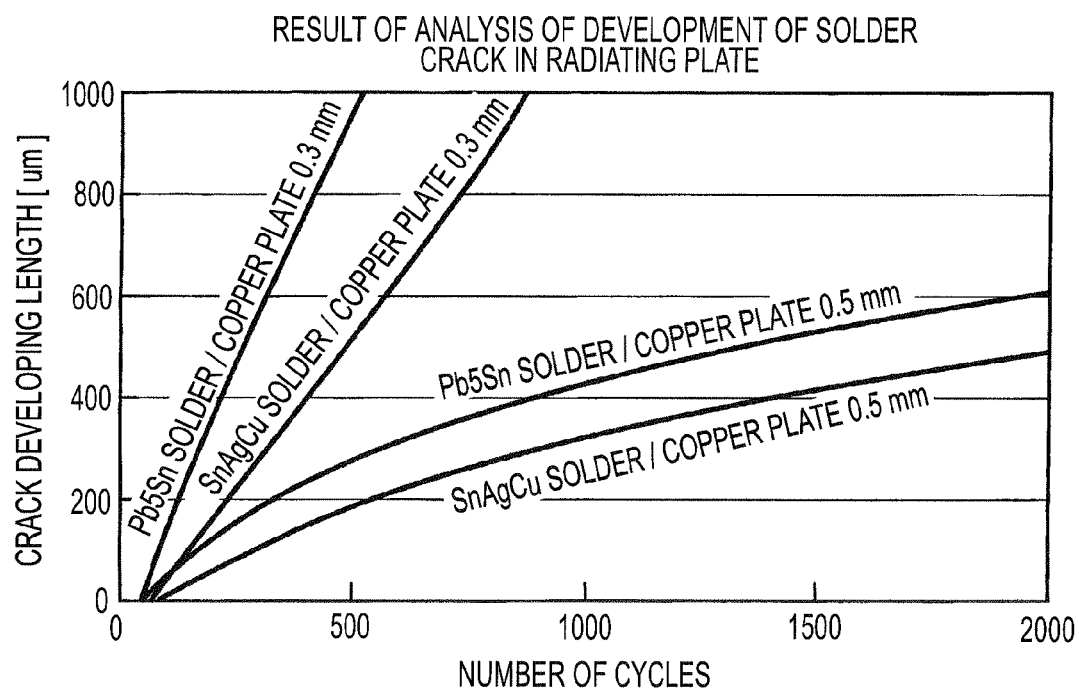
FIG. 3 is a graph showing a result of an analysis of a development of a crack through a heat of a solder on a radiating base plate side.

More specifically, FIG. 3 shows a result obtained by analyzing a relationship between the number of test cycles in an execution of a temperature cycle test (TCT) in a predetermined cycle temperature changing range and a length of a development of a crack in a solder bonding portion in the case in which the radiating base plate B is bonded to two copper plates having different thicknesses (0.3 mm and 0.5 mm) through the tin-lead based eutectic solder or the lead-free solder according to the invention respectively. From the analysis, it is apparent that the length of the development of the crack in the solder bonding portion is smaller in an identical temperature cycle, that is, an endurance of a solder bonding portion with respect to a temperature stress is higher in the case in which the lead-free solder is used than that in the case in which the tin-lead based solder is used.

The temperature cycle test (TCT) to be used in the example is based on a temperature cycle test in reliability standards of a semiconductor which are determined by JETA, that is, the Japan Electronics and Information Technology Industries Association. The test is carried out on a requirement for the number of times that ON/OFF is repeated in a single running operation in the case in which a semiconductor is provided on a car and a condition obtained by a characteristic of a material, for example. A cycle temperature changing range in the test is set to be −40° C. to 105° C.

Moreover, the conventionally known power semiconductor elements, for example, various elements such as IGBT, MOS-FET or FWD are used for the semiconductor elements S and S'. They contain silicon as a principal material.

In the circuit board P, moreover, a ratio "a" of a sum t1 of thicknesses of the first and second copper plates M1 and M2 to a thickness t2 of the insulating substrate C is set into a predetermined range (which is equal to or higher than 1.5 and is equal to or lower than 5.5 as will be described below) that can ensure an endurance to a temperature stress of each of the solders H1 and H2 in order to sufficiently maintain the endurance to the temperature stress of each of the solders H1 and H2.

The inventor investigated that the ratio "a" is an important parameter for ensuring the endurance to the temperature stress of each of the solders H1 and H2 based on a result of an analysis in a fatigue test for a solder bonding portion, and a technique for the analysis will be described below.

First of all, analytic models for the components of the circuit board P, the radiating base plate B, the solders H1 and H2, and the elements S and S' are created and the cycle temperature changing range is subsequently set in accordance with a predetermined temperature condition of the temperature cycle test (TCT) in order to carry out a thermal fatigue test of the solder bonding portion in the semiconductor device. Thus, an analytic condition is set.

Figure 4:
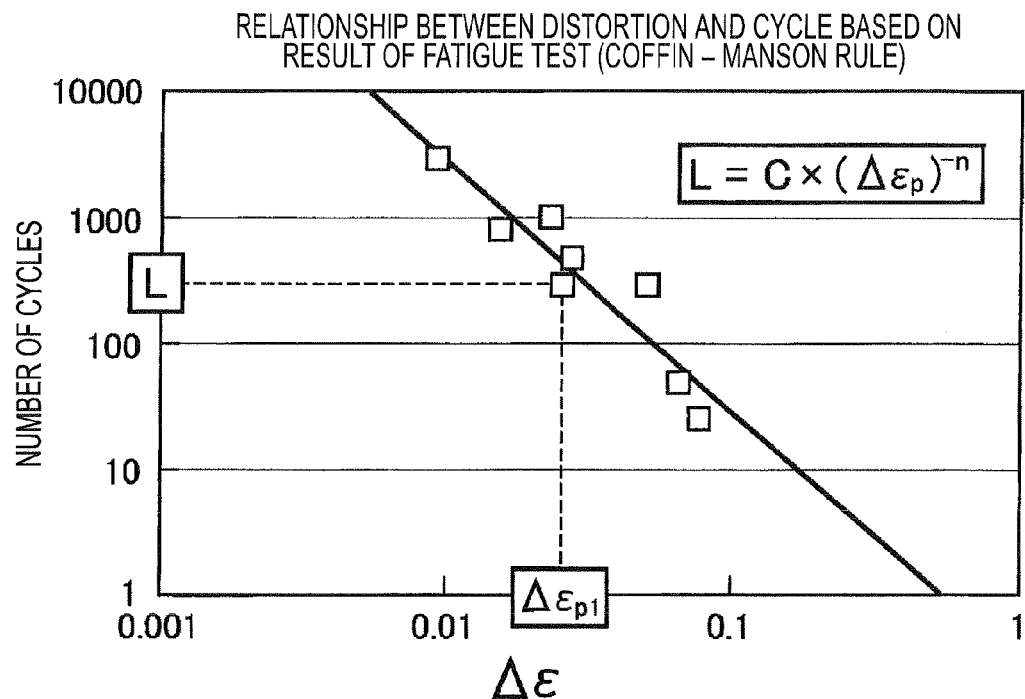
FIG. 4 is a graph showing a relationship between a distortion generated by using the Coffin-Manson rule and a temperature cycle through an analysis of a thermal fatigue test for the solder bonding portion of the power module.

Next, a structural analysis is executed through an actual experiment or a simulation by a computer, and a relationship between a distortion in the bonding portion of each of the solders H1 and H2 which is thus generated and the number of cycles in the temperature cycle test is obtained as shown in FIG. 4 based on the Coffin-Manson rule and an endurance reliability of the solder bonding portion is evaluated and decided on the basis of the relationship. Referring to FIG. 4, it is apparent that the number of life cycles (that is, the number of test cycles until a length of a development of a crack in the bonding portion reaches a specified limit) is increased and the endurance reliability of the solder bonding portion is thus enhanced if the distortion (that is, a temperature stress) generated in the solder bonding portion in each temperature cycle is reduced.

Based on the result of the analysis, there are respectively analyzed contribution ratios of thicknesses of the portions in the power module PM (for example, thicknesses of the elements S and S', thicknesses of the solders H1 and H2, thicknesses of the copper plates M1 and M2, a difference between the thicknesses of both of the copper plates M1 and M2, and a thickness of the base plate B) and a coefficient of thermal expansion to the endurance reliability of the bonding portion in each of the solders H1 and H2. Consequently, it is found that the contribution ratio of the thicknesses of the copper plates M1 and M2 in the thicknesses of the respective portions in the power module PM is the highest and the contribution ratios of the thicknesses of the other parts are comparatively low.

According to the result of the analysis, furthermore, it is found that the endurance reliability of the first solder H1 on the element side is increased if an average coefficient of thermal expansion of the circuit board P is reduced (that is, approximates to that of silicon to be the principal material of the elements S and S') and the endurance reliability of the second solder H2 on the base plate side is increased if the average coefficient of thermal expansion of the circuit board P is increased (that is, approximates to that of copper to be a component of the base plate B). It can be supposed that this is related to a dependency of the distortion generated in each of the solders H1 and H2 with a change in a temperature on a difference in a coefficient of thermal expansion of a structure interposing them.

Figure 5:
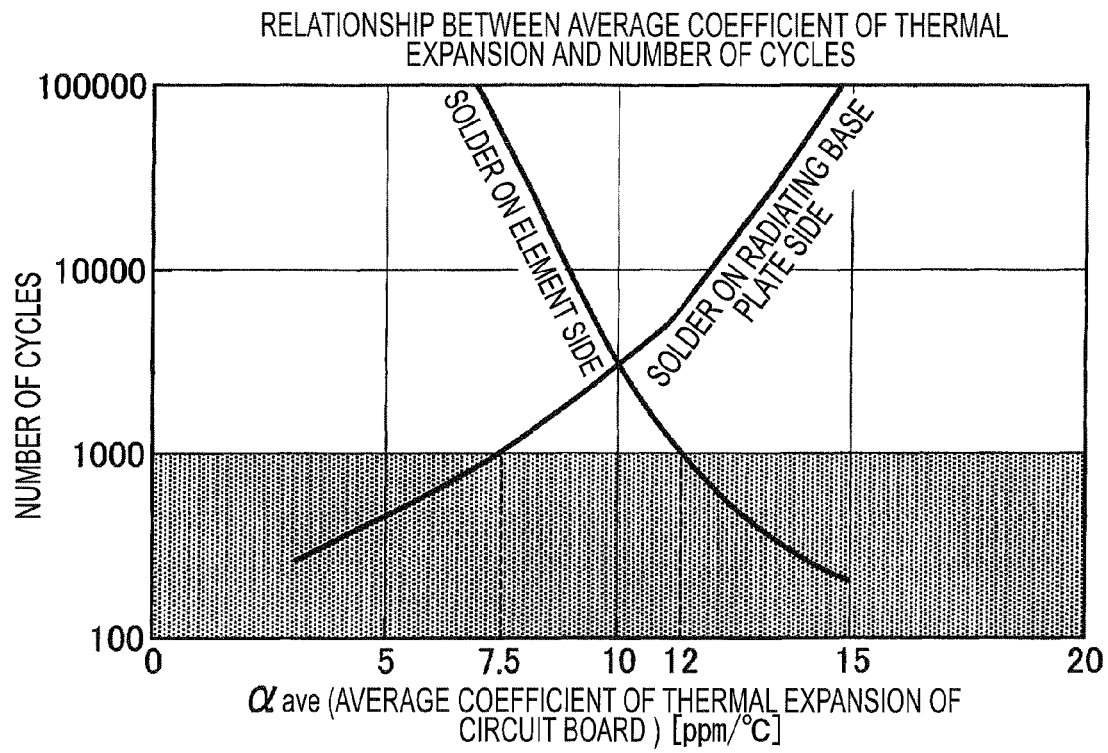
FIG. 5 is a graph showing a relationship between an average coefficient of thermal expansion $\alpha_{ave}$ of a circuit board and the number of cycles.

Next, there is examined a relationship between the average coefficient of thermal expansion $\alpha_{ave}$ of the circuit board P and the number of life cycles of the solder bonding portion. Consequently, a result shown in FIG. 5 is obtained. According to the result, the following is proved. The endurance reliability of the first solder H1 on the element side is enhanced if the average coefficient of thermal expansion $\alpha_{ave}$ of the circuit board P is reduced, while the endurance reliability of the second solder H2 on the base plate side is deteriorated if the average coefficient of thermal expansion $\alpha_{ave}$ of the circuit board P is reduced. Thus, there is a tendency that both of them are contrary to each other. Accordingly, it is necessary to select the thicknesses of the first and second copper plates M1 and M2 based on a specific region having the average coefficient of thermal expansion $\alpha_{ave}$ which satisfies the endurance reliabilities of the solders H1 and H2 at the same time.

Referring to the selection, it is assumed to meet a condition that the number of life cycles in the solder bonding portion is equal to or larger than a predetermined desirable number of cycles which is required for the solder bonding portion of the power module (is equal to or larger than 1000 cycles in the example) in the temperature cycle test (TCT) as a standard for satisfying the endurance reliabilities of the first and second solders H1 and H2. The average coefficient of thermal expansion $\alpha_{ave}$ of the circuit board P which satisfies the condition ranges from 7.5 to 12 ppm/° C. in FIG. 5. By using the circuit board P having the average coefficient of thermal expansion $\alpha_{ave}$ within this range, it is possible to satisfy the endurance reliabilities of both of the solders H1 and H2 at the same time. Thus, it is possible to satisfy a level required for the endurance reliability as the power module.

$a=t_M/t_C$ is obtained, wherein a ratio of a sum $t_M$ of the thicknesses of the first and second copper plates M1 and M2 to a thickness $t_C$ of the insulating substrate is represented by a.

Moreover, $\alpha_{ave}$ can be expressed in the following equation, wherein the average coefficient of thermal expansion of the circuit board P is represented by $\alpha_{ave}$ a coefficient of thermal expansion and a Young's modulus of the insulating substrate C formed of ceramics are represented by $\alpha_C$ and $E_C$ respectively, and a coefficient of thermal expansion and a Young's modulus of a copper material of each of the copper plates M1 and M2 are represented by $\alpha_M$ and $E_M$ respectively.

$$\alpha_{ave}=(a \cdot \alpha_M \cdot E_M + \alpha_C \cdot E_C)/(aE_M+E_C)$$

Figure 6:
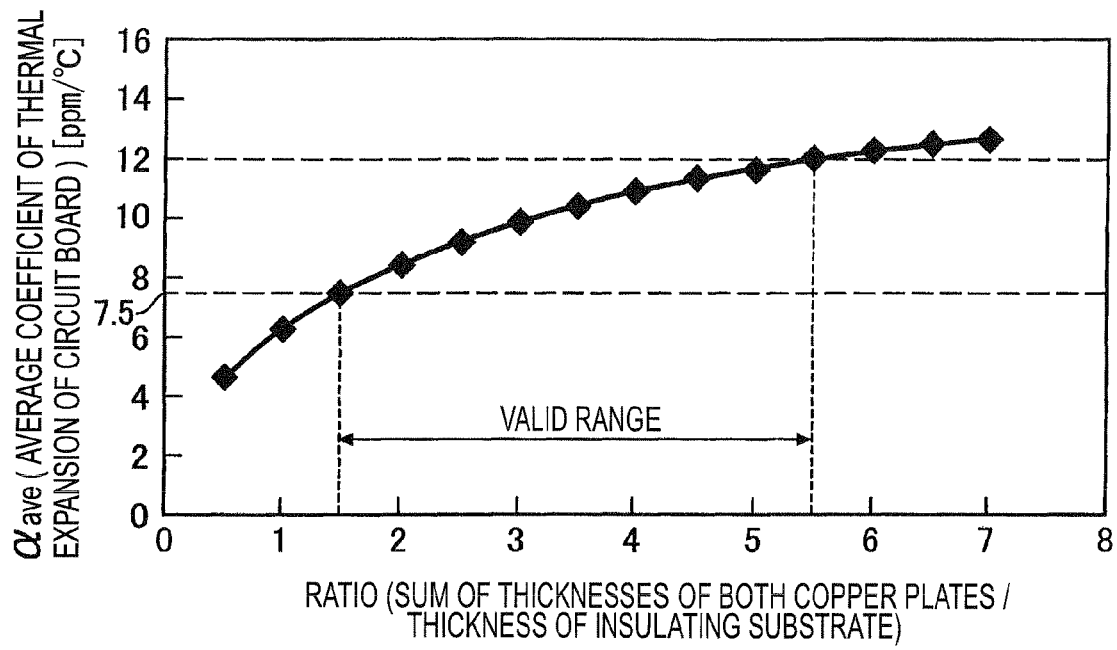
FIG. 6 is a graph showing a relationship between the average coefficient of thermal expansion a $\alpha_{ave}$ of the circuit board and a ratio "a" of a sum $_{tM}$ of plate thicknesses of both copper plates in the circuit board to a plate thickness $_{tC}$ of an insulating substrate.

The equation can be expressed in a graph of FIG. 6 showing a relationship between the ratio "a" and the average coefficient of thermal expansion $\alpha_{ave}$ of the circuit board P. In the graph, the ratio "a" to satisfy a range of (7.5 to 12 ppm/° C.) of the average coefficient of thermal expansion $\alpha_{ave}$, of the circuit board P to meet the endurance reliabilities of the first and second solders H1 and H2 at the same time ranges from 1.5 to 5.5.

By selecting the thicknesses of the first and second copper plates M1 and M2 to satisfy the range of the ratio "a", accordingly, it is possible to choose the thicknesses of the first and second copper plates M1 and M2 which can satisfy the endurance reliabilities of the first and second solders H1 and H2 at the same time.

Figure 7:
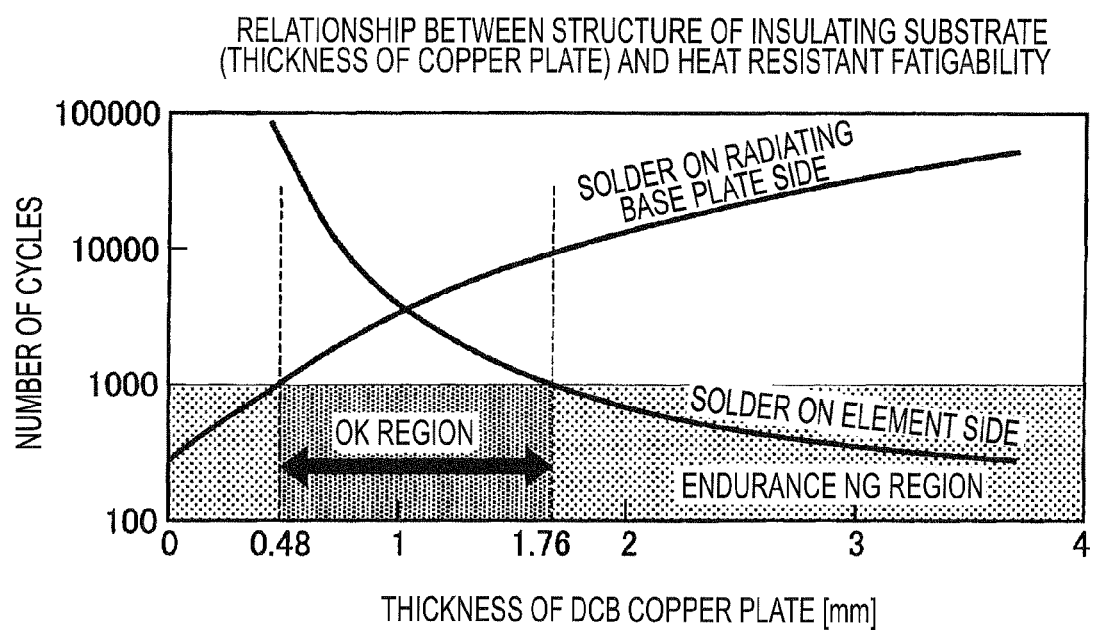
FIG. 7 is a graph showing a relationship between the thickness of the copperplate in the circuit board and the number of cycles.

For example, in the standard power module PM in which an insulating substrate has a thickness $t_C$ of 0.32 mm, the condition that the ratio "a" ($=t_M/t_C$) is $1.5 \leq a \leq 5.5$ is applied to calculate the sum $t_M$ of the thicknesses of the first and second copper plates M1 and M2. Consequently, the sum $t_M$ ranges from 0.48 mm to 1.76 mm. On the other hand, FIG. 7 shows a graph in which an axis of abscissa indicates the sum $t_M$ of the thicknesses of the first and second copper plates M1 and M2 for the power module PM and an axis of ordinate indicates the number of temperature cycles in the temperature cycle test (TCT), and the numbers of life cycles of the first and second solders H1 and H2 are experimentally obtained. In the graph, within a range in which the sum $t_M$ of the thicknesses of the first and second copper plates M1 and M2 is 0.48 mm to 1.76 mm (which is displayed as an OK region in FIG. 7), the number of life cycles of each of the first and second solders H1 and H2 is equal to or larger than the predetermined desirable number of cycles (1000 in the example). Thus, it is apparent that each of the solder bonding portions has a sufficient endurance reliability.

In the case in which the semiconductor elements S and S' and the radiating base plate B are soldered to the copper plates M1 and M2 on one of the surfaces and the other surface in the circuit board P having the structure described above to manufacture the power module PM, a processing for bonding the semiconductors S and S' to the external surface of the first copper plate M1 on the element side of the circuit board P through the first lead-free solder H1 and a processing for bonding the radiating base plate B to the external surface of the second copper plate M2 on the base plate side through the second lead-free solder H2 are executed on the same heating condition at the same time.

The solder processing is carried out in the conventionally known reflow furnace (not shown) to be a processing furnace, and a reflow temperature at that time is set to be equal to or higher than 240° C. and to be equal to or lower than 320° C. as a heating temperature at which the whole solders H1 and H2 are uniformly molten in the reflow furnace and the endurance reliability of the bonding portions of the semiconductor elements S and S' is obtained. By thus setting the reflow temperature, it is possible to simultaneously heat and melt the respective solders H1 and H2 at the heating temperature at which the whole solders H1 and H2 are uniformly molten in the reflow furnace and the endurance reliability of the bonding portions of the semiconductor elements S and S' is obtained and to precisely carry out the bond processing over both of the solder bonding portions.

In the processing for bonding the respective solders H1 and H2, for example, the external surface of the second copper plate M2 on the base plate side of the circuit board P is mounted in a predetermined position on the radiating base plate B in a state in which the thin-plate like second lead-free solder H2 preformed to take a predetermined shape is interposed therebetween, and furthermore, the semiconductor elements S and S' are mounted in a predetermined position of the external surface of the first copper plate M1 on the element side of the circuit board P with the preformed thin-plate like first lead-free solder H1 interposed therebetween, and a product thus obtained is set into the reflow furnace preheated to a predetermined reflow temperature and is heated for a predetermined time to melt the respective solders H1 and H2, and the product is then taken out of the reflow furnace and is thus cooled and solidified. In this way, the solder processing is carried out.

In the circuit board P of the power module PM according to the example, the ratio "a" ($=t_M/t_C$) of the sum $t_M$ of the thicknesses of the first and second copper plates M1 and M2 on both sides of the insulating substrate C to the thickness $t_C$ of the insulating substrate C is set into a predetermined and limited range, that is, a range which is equal to or higher than 1.5 and is equal to or lower than 5.5 in order to ensure the endurance to the temperature stresses of the first and second solders H1 and H2 formed by the lead-free solder materials of the same type (which are identical to each other in the example). In addition, by using, for both of the solder bonding portions, the lead-free solder which has a sufficiently higher melting temperature (approximately 220° C.) than an operating temperature (160° C. or less) of the elements S and S', is not molten again by a heat generation in the use of the element and can be expected to be enhanced in an endurance to a heat more greatly than that in the case in which a tin-lead based solder is used, it is possible to carry out the bond processing over them in a lump in the reflow furnace at the reflow temperature (that is, a temperature which is equal to or higher than 240° C. and is equal to or lower than 320° C.)

Therefore, it is possible to sufficiently ensure the endurance reliability of the bonding portions through the first and second solders H1 and H2 for bonding the first and second copper plates M1 and M2 on both surfaces of the circuit board P to the elements S and S' and radiating base plate B respectively without employing a special technique such as resin sealing and using a particular solder material to which an expensive additive such as a rare metal is added. In addition, both of the solder bonding portions can be subjected to the bond processing in a lump. Consequently, it is possible to wholly carry out the bonding work easily, rapidly and efficiently.

Even if an inexpensive lead-free solder material to be used conventionally and usually (that is, an inexpensive lead-free solder material which is an SnCu based, SnAg based or SnAgCu based alloy and does not contain a rare metal as an additive) is utilized in the bonding portions of both of the solders H1 and H2, consequently, it is possible to sufficiently ensure the endurance reliability of the solder bonding portions, and furthermore, to achieve a reduction in a cost through a decrease in a material cost or steps as compared with the conventional device.

According to the first, third and fourth aspects of the invention, it is possible to sufficiently ensure an endurance reliability of a solder bonding portion for bonding the first and second metal plates on both surfaces of the circuit board to the element and the radiating base plate in the semiconductor device respectively without employing a special technique such as resin sealing and using a special solder material to which an expensive additive material such as a rare metal is added. In addition, it is possible to carry out a bond processing in a lump by using the solder materials of the same type for both of the solder bonding portions. Therefore, it is possible to carry out a bonding work easily, rapidly and efficiently. Thus, it is possible to achieve a reduction in a cost through a decrease in a material cost or steps while ensuring the endurance reliability of both of the solder bonding portions.

According to the second and fifth aspects of the invention, moreover, it is possible to use an inexpensive lead-free solder in both of the solder bonding portions. Even if the inexpensive lead-free solder is used, moreover, it is possible to achieve a reduction in the cost through a decrease in the material cost or steps while ensuring the endurance reliability of the bonding portions.

According to the sixth aspect of the invention, furthermore, it is possible to simultaneously heat and melt the respective solders at the heating temperature at which the whole solder is uniformly molten in the reflow furnace and the endurance reliability of the bonding portion to the semiconductor element is obtained, thereby carrying out the bond processing precisely.

Although the embodiment according to the invention has been described above, the invention is not restricted to the embodiment but a design can be variously changed without departing from the invention described in the claims.

Although the copper plate has been used as the metal plate to be utilized as the radiating base plate in the example, for instance, a base plate may be constituted by a composite material of copper, aluminum, tungsten and molybdenum in the invention.

What is claimed is:

1. A semiconductor device comprising:
    a circuit board formed by integrally bonding a first metal plate and a second metal plate to both surfaces of an insulating substrate respectively,
    at least one semiconductor element bonded to an external surface of the first metal plate through a first solder, and
    a radiating base plate bonded to an external surface of the second metal plate through a second solder,
    wherein the first solder and the second solder are constituted by solder materials of the same type,
    wherein an average coefficient of thermal expansion of the circuit board is set to satisfy a plurality of endurance cycles in accordance with endurance characteristics of the first and second solders, and
    wherein a sum of thicknesses of the first metal plate and the second metal plate and a thickness of the insulating substrate are set based on a relationship between the average coefficient of thermal expansion and a ratio of the sum of thicknesses of the first metal plate and the second metal plate to the thickness of the insulating substrate.

2. The semiconductor device according to claim 1, wherein the first solder and the second solder are lead-free solders formed by an SnCu based, SnAg based or SnAgCu based alloy, and do not contain a rare metal.

3. A method of manufacturing a semiconductor device comprising a circuit board formed by integrally bonding a first metal plate and a second metal plate to both surfaces of an insulating substrate respectively, at least one semiconductor element bonded to an external surface of the first metal plate through a first solder, and a radiating base plate bonded to an external surface of the second metal plate through a second solder, the method comprising the steps of:
    manufacturing the circuit board in such a manner that a ratio of a sum of thicknesses of the first metal plate and the second metal plate to a thickness of the insulating substrate is set in a predetermined range in which an endurance to a temperature stress of each of the first and the second solders is ensured; and
    executing a processing for bonding the semiconductor elements to the external surface of the first metal plate of the circuit board through the first solder and a processing for bonding the base plate to the external surface of the second metal plate through the second solder at the same time under the same heating conditions,
    wherein the first solder and the second solder are constituted by lead-free solder materials of the same type,
    wherein an average coefficient of thermal expansion of the circuit board is set to satisfy a plurality of endurance cycles in accordance with endurance characteristics of the first and second solders, and
    wherein a sum of thicknesses of the first metal plate and the second metal plate and a thickness of the insulating substrate are set based on a relationship between the average coefficient of thermal expansion and a ratio of the sum of thicknesses of the first metal plate and the second metal plate to the thickness of the insulating substrate.

4. The method of manufacturing a semiconductor device according to claim 3, wherein the ratio is in a range of from 1.5 to 5.5.

5. The method of manufacturing a semiconductor device according to claim 3, wherein the first solder and the second solder are formed by SnCu based, SnAg based or SnAgCu based alloys, and do not contain a rare metal.

6. The method of manufacturing a semiconductor device according to claim 3, wherein the processings are carried out in a reflow furnace in a reflow temperature of from 240° C. to 320° C.

7. The semiconductor device according to claim 1, wherein:
    the first metal plate and the second metal plate are formed of copper.

8. The semiconductor device according to claim 1, wherein:
    the average coefficient of thermal expansion of the circuit board is within a range of 7.5 to 12 ppm/° C.

9. The semiconductor device according to claim 1, wherein the ratio of the sum of the thicknesses of the first metal plate and the second metal plate to the thickness of the insulating substrate is set in a range of from 1.5 to 5.5 to ensure an endurance to a temperature stress of each of the first solder and the second solder.

* * * * *